United States Patent
Chesca et al.

(10) Patent No.: US 10,732,234 B2
(45) Date of Patent: Aug. 4, 2020

(54) SUPERCONDUCTING MAGNETIC SENSOR

(71) Applicant: LOUGHBOROUGH UNIVERSITY, Loughborough (GB)

(72) Inventors: Boris Chesca, Loughborough (GB); Daniel John, Loughborough (GB)

(73) Assignee: LOUGHBOROUGH UNIVERSITY, Loughborough (GB)

( * ) Notice: Subject to any disclaimer, the term of this patent is extended or adjusted under 35 U.S.C. 154(b) by 43 days.

(21) Appl. No.: 15/738,963

(22) PCT Filed: Jun. 23, 2016

(86) PCT No.: PCT/GB2016/051880
§ 371 (c)(1),
(2) Date: Dec. 21, 2017

(87) PCT Pub. No.: WO2017/006079
PCT Pub. Date: Jan. 12, 2017

(65) Prior Publication Data
US 2018/0164385 A1 Jun. 14, 2018

(30) Foreign Application Priority Data
Jul. 6, 2015 (GB) .................................. 1511803.7

(51) Int. Cl.
*G01R 33/02* (2006.01)
*G01R 33/035* (2006.01)
(Continued)

(52) U.S. Cl.
CPC ..... *G01R 33/0358* (2013.01); *G01R 33/0354* (2013.01); *G01R 33/0356* (2013.01);
(Continued)

(58) Field of Classification Search
CPC .............. G01R 33/0354; G01R 33/035; G01R 33/0356; G01R 33/0358; G01R 33/02; G01R 33/0385
(Continued)

(56) References Cited

U.S. PATENT DOCUMENTS 5,114,912 A  5/1992  Benz et al.
5,790,078 A  8/1998  Suzuki et al.
(Continued)

FOREIGN PATENT DOCUMENTS

| | | |
|---|---|---|
| CA | 1178344 | 11/1984 |
| EP | 1387178 A1 | 2/2004 |
| WO | 96-38737 A1 | 12/1996 |

OTHER PUBLICATIONS

Palmer and Mercereau: "Coherent effects in large arrays of superconducting bridges", *California Institute of Technology*, AIP Publishing, Pasadena, CA, Jun. 19, 1974, vol. 25, No. 8; pp. 467-469, http://dx.doi.org/10.1063/1.1655552.
(Continued)

*Primary Examiner* — Raul J Rios Russo
(74) *Attorney, Agent, or Firm* — Kilpatrick Townsend & Stockton LLP (57) ABSTRACT

A magnetometer for measuring a magnetic flux and also the absolute magnetic flux, the magnetometer comprising a plurality of superconducting quantum devices (SQUIDs) connected in series, each SQUID including: a superconducting loop containing two Josephson junctions connected to each other in parallel; and a flux-focussing region, the flux-focussing region configured to generate a screening current in response to the magnetic flux, the screening current modulating the corresponding voltage response for each SQUID which is in-phase with the voltage response of each other SQUID in the array.

20 Claims, 8 Drawing Sheets

(51) Int. Cl.
*G01R 33/05* (2006.01)
*H01L 27/18* (2006.01)
*H01L 39/22* (2006.01)
*G01R 33/038* (2006.01)

(52) U.S. Cl.
CPC .............. *G01R 33/05* (2013.01); *H01L 27/18* (2013.01); *H01L 39/223* (2013.01); *G01R 33/02* (2013.01); *G01R 33/0385* (2013.01)

(58) Field of Classification Search
USPC ............ 324/51, 55, 200, 227, 228, 244, 248
See application file for complete search history.

(56) References Cited

U.S. PATENT DOCUMENTS

| | | | |
|---|---|---|---|
| 5,901,453 A | 5/1999 | Zhang et al. | |
| 6,690,162 B1 | 2/2004 | Schopohl et al. | |
| 7,369,093 B2 | 5/2008 | Oppenlander et al. | |
| 8,149,133 B2 | 4/2012 | Milne | |
| 8,179,133 B1 | 5/2012 | Kornev et al. | |
| 8,548,542 B2 | 10/2013 | Hatsukade et al. | |
| 2003/0098455 A1* | 5/2003 | Amin ................. | G01R 33/0354 257/31 |
| 2005/0052181 A1* | 3/2005 | Lam ................... | G01R 33/0356 324/242 |
| 2006/0145694 A1* | 7/2006 | Oppenlander ..... | G01R 33/0358 324/248 |
| 2007/0241747 A1* | 10/2007 | Morley .............. | G01R 33/0354 324/248 |
| 2008/0001599 A1* | 1/2008 | Wu ...................... | G01R 33/028 324/248 |
| 2010/0097056 A1* | 4/2010 | Lam ................... | G01R 33/0354 324/228 |
| 2011/0065585 A1 | 3/2011 | Lanting et al. | |
| 2011/0285393 A1* | 11/2011 | Zakosarenko ....... | G01R 33/035 324/248 |
| 2016/0149111 A1* | 5/2016 | Cybart ................ | H01L 39/025 505/190 |
| 2019/0288174 A1* | 9/2019 | Cybart ................ | H01L 39/025 |

OTHER PUBLICATIONS

Sandell et al.: "Flux Modulated Coherent Radiation From Arrays of Josephson Microbridges Coupled by SuperConducting Loops", IEEE Transactions on Magnetics, Los Alamitos, CA, US, vol. Mag-15, No. 1, Jan. 1979 , pp. 1-3.

Likharev: "Superconducting weak links", Department of Physics, Moscow State University, Moscow: Reviews of Modern Physics, vol. 51, No. 1, Jan. 1979, pp. 102-159.

Chesca et al.: "Dual flux-to-voltage response of YBa2Cu3O7 asymmetric parallel arrays of Josephson junctions", Department of Physics, Loughborough University, Loughborough, UK, Feb. 5, 2014, pp. 1-5; doi:10.1088/0953-2048/27/5/055019.

Chesca et al.: "Amplification of electromagnetic waves excited by a chain of propagating magnetic vortices in YBa2Cu3O7-δ Josephson-junction arrays at 77K and above" Department of Physics, Loughborough University, Loughborough, UK, Jun. 6, 2014, pp. 1-5, doi:10.1088/0953-2048/27/8/085015.

Chesca et al.: "Parallel array of YBa2Cu3O72d superconducting Josephson vortex-flow transistors with high current gains", *AIP Publishing LLC*; Applied Physics Letters, Aug. 28, 2013, pp. 1-4; http://dx.doi.org/10.1063/1.4819461.

International Search Report and Written Opinion of PCT/GB2016/051880 dated Jan. 2015, all pages.

Soon-Gul Lee et al: "Serial array high Tc SQUID magnetometer", IEEE Transactions on Applied Superconductivity, IEEE Service Center, Los Alamitos, CA, US, vol. 7, No. 2, Jun. 1, 1997 (Jun. 1, 1997), pp. 3347-3350, XP011501171,ISSN: 1051-8223, DOI: 10.1109/77.622083.

Kin Li et al: "Measurement and simulation of the voltage-flux transfer function of SQUID arrays", IEEE Transactions on Applied Superconductivity, IEEE Service Center, Los Alamitos, CA, US, vol. 5, No. 2, Jun. 1, 1995 (Jun. 1, 1995 ), pp. 3255-3258, XP011504663,ISSN: 1051-8223, DOI: 10.1109/77.403286.

Chesca Boris et al: "Parallel array of YBaCuOsuperconducting Josephson vortex-flow transistors with high current gains", Applied Physics Letters, A I P Publishing LLC, US, vol. 103, No. 9, Aug. 26, 2013 (Aug. 26, 2013), pp. 92601-92601, XP012175096,ISSN: 0003-6951, DOI: 10.1063/1.4819461 [retrieved on Aug. 28, 2013].

Chesca Boris et al: "Flux-coherent series SQUID array magnetometers operating above 77 K with superior white flux noise than single-SQUIDs at 4.2 K",Applied Physics Letters, A I P Publishing LLC, US, vol. 107, No. 16, Oct. 19, 2015 (Oct. 19, 2015), XP012201465,ISSN: 0003-6951, DOI: 10.1063/1.4932969.

* cited by examiner

SUPERCONDUCTING MAGNETIC SENSOR

CROSS-REFERENCE TO RELATED APPLICATIONS

This application is a U.S. National Stage of PCT Application No. PCT/GB2016/051880, filed Jun. 23, 2016, which claims priority to Foreign Application No. 1511803.7 GB, filed Jul. 6, 2015. Each of these applications is hereby incorporated by reference in its entirety for all purposes.

FIELD OF THE INVENTION

The present invention relates to magnetometers for measuring magnetic flux or absolute magnetic field, particularly to magnetometers including an array of superconducting quantum interference devices.

BACKGROUND OF THE INVENTION

There are many reasons why it is desirable to measure the strength of a magnetic flux or a magnetic field with high sensitivity. At present, the most sensitive magnetometers are those based on superconducting quantum interference devices (SQUIDs). These are responsive to very small changes in magnetic flux, and so can be used to measure any physical quantity that can be converted into a magnetic flux, e.g. electric currents and mechanical displacements.

SQUIDs operate on the principle of the Josephson Effect, whereby a supercurrent is able to flow through a thin insulating barrier or a weak-link between two superconductors, without a voltage drop across the barrier, as a result of quantum tunnelling of superconducting Cooper pairs. Such a junction between the two superconductors is known as a Josephson junction. There are two types of SQUIDs, DC SQUIDs and RF SQUIDS.

DC SQUIDs are formed of a loop of superconducting material, with two Josephson junctions connected in parallel on the loop. Therefore, two paths along which the supercurrent can flow are provided, each containing one Josephson junction. When a current I flows through the loop, it splits equally between the two branches of the loop. When an external magnetic field B, with an associated external flux $\phi$ is applied to the loop, a screening current $I_s$ begins to flow in the loop, in order to cancel the effects of the applied magnetic field. This screening current will flow in opposite directions in each branch of the loop, so the current in one branch is equal to $(I/2+I_s)$ and in the other, it is equal to $(I/2-I_s)$.

It is known that the magnetic flux which passes through a superconducting loop must be an integer multiple of the flux quantum $\phi_0$. Therefore, the screening current changes direction depending on whether it is more energetically favourable to cancel or enhance the magnetic flux to be a multiple of $\phi_0$. Therefore, the screening current varies periodically with a period of $\phi_0$. When the current in either branch exceeds the critical current of the Josephson junction $I_C$, there is a voltage drop across the SQUID, which can then be measured in order to obtain a value for the flux $\phi$.

Since the flux quantization in the loop is not perfect in practice, a parameter $\beta_L$ can be defined, given by $\beta_L=2\pi I_C L_{SQ}/\phi_0$ where $L_{SQ}$ is the self-inductance of the SQUID itself. The SQUID sensitivity is optimised when $\beta_L=1$.

DC SQUIDs are relative magnetometers, meaning that they can only measure the change in the magnetic flux, from the change in the voltage across the SQUID. Therefore, they require some kind of calibration in order to obtain an absolute value of the incident magnetic flux.

SQUIDs have traditionally been made of metals such as niobium. However, these must be cooled using liquid helium in order to fall below the critical temperature at which they become superconducting. More recently, however, high temperature superconductors have been developed, which can operate at much higher temperatures. These are advantageous because they can be cooled using much cheaper liquid nitrogen or inexpensive cryogen-free cryocoolers.

In order to obtain improved results, it is known to use an array of SQUIDs, rather than a single SQUID. A superconducting interference filter (SQIF) is a type of magnetometer which operates in this way. Then, the combined responses of the SQUIDs can be used to provide a readout. U.S. Pat. No. 8,179,133 describes a magnetic field detector including an irregular array of SQUIDs, configured so that their combined output sums to produce a linear output (using a Fourier series), which is then used to measure a change in magnetic field strength. U.S. Pat. No. 7,369,093 discloses a similar device, where the array is configured so that the $\phi_0$-periodic component of the output signal is suppressed.

SUMMARY OF THE INVENTION

The present invention aims to improve on the devices described above in order to provide a magnetometer, which is able to measure the changes in an incident magnetic flux or the absolute magnetic flux with increased sensitivity.

This improvement is expected at all temperatures, in particular, in the most common temperature range in applications 4.2-90 K.

Accordingly a first preferred aspect of the present invention provides a magnetometer for measuring an applied magnetic flux, the magnetometer comprising an array of superconducting quantum devices (SQUIDs) connected in series, each SQUID including: a superconducting loop containing two Josephson junctions connected to each other in parallel; and a flux-focussing region, the flux focussing region configured to generate a screening current in response to the applied magnetic flux, the screening current modulating the corresponding voltage response for each SQUID such that the voltage response of the SQUID is in-phase with the voltage response of each other SQUID in the array. In other words the series SQUID array operates flux-coherently.

The simultaneous and equal coupling of the magnetic flux to all of the flux-focussing regions means that the resultant voltage responses of all individual SQUIDs are in-phase. Here, "in-phase" operation or "flux-coherent" operation (the two terms used interchangeably throughout) refers to the above-described periodic relationship between the magnetic flux and the voltage across the SQUID. It should therefore be understood that the "in-phase" responses of the SQUIDs mean that the SQUIDs behave as a coherent array.

In this way, when a voltage response is measured across the whole array of SQUIDs, the resultant measurement represents the sum of the individual voltage responses of the SQUIDs which make up the array, because they are serially connected (i.e. connected in series). The increased magnitude of the response therefore means that a larger signal can be obtained for the measurement. Ideally, theoretically, the output voltage signal V (or equivalently the transfer function $V_\phi$) is N times larger than that of an individual DC SQUID, N being the total number of DC SQUIDs in the serial array. Since the voltage noise $(S_V)^{1/2}$ of N non-interacting SQUIDs connected in series associated with these measurements only increases with $N^{1/2}$ the white flux noise (also called the flux density noise) of such a series magnetometer defined as $(S_\phi)^{1/2}=(S_V)^{1/2}/V_\phi$, scales as $1/N^{1/2}$. The flux density noise being the most important figure of merit of a magnetometer therefore decreases with increasing N. The smaller $(S_\phi)^{1/2}$ the better the magnetometer field sensitivity $S_B^{1/2}=S_\phi^{1/2}/A_{eff}$ ($A_{eff}$ is the effective flux capture area of the magnetometer) and its energy resolution, $\varepsilon=S_\phi/2L$ (L is the individual SQUID inductance). Therefore a series DC SQUID array, with all the DC SQUIDs operating flux-coherently, provides a more sensitive magnetometer. The superiority of the series SQUID array over the single DC SQUID as far as its white flux noise, field sensitivity and energy resolution are concerned is expected at all temperatures, especially in the most common temperature range in most applications of 4.2-90 K.

In addition, the read-out electronics of such a magnetometer based on a series SQUID array is significantly simplified as for such a large output voltages a low-noise pre-amplifier is not required anymore.

The significance of the "flux-coherent" operation is briefly explained next.

Each SQUID "I" may have a voltage $V_i$ output response that can be approximated by $V_i=V_{i,max}\cos(\phi/\phi_0)$. For example, in the ideal situation that all SQUIDs connected in series are "flux-coherent" and identical, the total output response of a serial SQUID array consisting of N identical SQUIDs will be $V_i=NV_{i,max}\cos(\phi/\phi_0)$, i.e., N times larger than that of an individual SQUID. Therefore if the "flux-coherent" condition is achieved the sensitivity advantages that arise from using a serial array of SQUIDs can be exploited. To achieve the in-phase (flux-coherent) operation two important conditions should be fulfilled:
A) the parasitic inductances between non-successive SQUIDs have to be negligibly small;
B) the mutual inductance $M_i$ between each pair of successive SQUIDs i and i=1 is small enough so that the flux $M_iI$ associated with the bias current I is negligible small in comparison with a flux quanta per each SQUID loop: $M_iI<<\phi_0$.
C) The mutual inductances between each SQUID and the input coil are all approximately the same.

Due to the periodicity of the cosine function, the flux-coherent operation can also be achieved if two other conditions are fulfilled:
A) the parasitic inductances between non-successive SQUIDs have to be negligibly small;
B) the mutual inductance $M_i$ between each pair of successive SQUIDs i and i=1 has such a value that the flux $M_iI$ associated with the bias current I is a multiple of flux quanta $\phi_0$.

The size of the flux-focussing regions is directly linked to the size of the generated screening current. Therefore, it is desirable to have a large flux-focussing region available to each SQUID. There is an associated trade-off with the size of the screening current and the noise generated in the flux-focussing regions as a result of the Lorentz force acting on the flux vortices that are pinned at defects in the superconducting material.

The magnetometer is best adapted to measure accurately magnetic fluxes which vary only on spatial scales much greater than the extent of the magnetometer itself, and which are also constant in time over the spatial extent of the magnetometer itself. Otherwise, the time and/or spatial variations in the fluxes incident on the flux-focussing regions can cause the voltage responses of SQUIDs within the array to fall out of phase, leading to a loss of the coherence in the array.

The magnetometer may also include a pick-up coil inductively coupled to the array.

Clearly then, from a measurement of the magnetic flux, the magnetic field can be calculated given the relationship $\phi=B.A$, where $\phi$ is the flux, B is the vector magnetic field strength, measured in Tesla (also called magnetic flux density) and A is the area through which the flux passes. In scalar form, this can be expressed as $\phi=BA$ where B is the magnitude of the magnetic field strength and A represents the area perpendicular to the direction of the applied magnetic field. The area over which the flux is measured is an integral area consisting of the SQUID array, the SQUID flux-focusing areas and, where present, the variable-width multiloop pick-up coils which are inductively coupled to the SQUID array.

That is the multiloop pick-up coils are galvanically disconnected from the SQUID array. As previously mentioned the white flux noise of a series array of identical non-interacting SQUIDs $(S_\phi)^{1/2}=(S_V)^{1/2}/V_\phi$ scales as $1/N^{1/2}$ times the white noise flux of a single DC SQUID. For the particular SQUID series array we fabricated that has 484 SQUIDs it follows that we improved the white flux noise of magnetometers by approximatively $(484)^{1/2}$ i.e., by a factor of 22 times.

The magnetometer may have any one or, to the extent that they are compatible, any combination of the following optional features.

The phase difference between adjacent SQUIDs can be defined as the difference in the arguments $(\phi_i-\phi_{i+1})/\phi_0$ of the respective cosine functions of their individual output voltages, where $V_i=V_{i,max}\cos(\phi_i/\phi_0)$ and $V_{i+1}=V_{i+1,max}\cos(\phi_{i+1}/\phi_0)$. Preferably, the phase difference $(\phi_i-\phi_{i+1})/\phi_0$ is less than $\pi/(10N)$, with N being the total number of SQUIDs. However, if this phase difference is a multiple of $2\pi$ then the magnetometer will again operate ideally. In addition if this phase difference takes values between $\pi/N$ and $\pi/(10N)$ then the magnetometer, although will not operate ideally, it will still have a superior flux sensitivity in comparison to a magnetometer based on a single DC SQUID. Improved flux-coherence (and flux sensitivity) can therefore be achieved so long as the phase difference, as defined above, deviates from $2\pi k$ by no more than $\pi/N$, for integer k.

k can take any whole number value greater than and including zero, i.e. k=0, 1, 2 . . . . Preferably, k=0.

Each superconducting loop preferably contains a first half-loop of superconducting material and a second half-loop of superconducting material, the first half-loop separated from the second half-loop by a gap (weak-link) which forms the two Josephson junctions.

Preferably, the flux-focussing region is an additional portion of superconducting material connected to a portion of the superconducting loop of each SQUID. The connection between the superconducting material of the flux-focussing region and the superconducting material of the loop is a superconducting connection.

Preferably, the additional portion of superconducting material is integrally formed with the superconducting loop of the SQUID. This reduces the losses associated with the connection, and results in an increased signal. Preferably the flux-focussing regions which are connected to a portion of the superconducting loop of the SQUID extend outwards from the array in a direction which is perpendicular or substantially perpendicular to a long axis of the array. The array of SQUIDs is preferably connected in a linear pattern, so as to form a straight or substantially straight line.

In the case of a linear array, a long axis of the array is an axis which runs parallel or substantially parallel to this line. Each side of the long axis may be defined as a first side and a second side.

Preferable, each flux-focussing region has a length, measured in a direction perpendicular to the long axis of the array and a width, measured in a direction parallel to the long axis of the array, the length being greater than the width. Each flux-focussing region may therefore have a rectangular shape. Optionally, the length of the flux-focussing region may be at least twice the width of the flux-focussing region.

In this case, as is desirable, the longer the long sides of the rectangle, the greater the area of the flux-focussing region, and a greater flux which is incident on the flux-focussing region, leading to an increased signal.

More than one SQUID may share the same flux-focussing region. For example, each flux-focussing region may be connected to two SQUIDs, and/or each SQUID may be connected to at least part of each of two flux-focussing regions. Preferably, the flux-focussing regions are arranged in an alternating pattern between the first side and second side of the long axis.

Preferably the array is formed of a series of repeating units, wherein each repeating unit includes: a first-side flux-focussing region on a first side of the array connected to: a first-side half-loop of a first superconducting loop, and a first-side half-loop of a second superconducting loop; and a second-side flux-focussing region on a second side of the array connected to: a second-side half-loop of the second superconducting loop, and a second-side half-loop of a third superconducting loop.

Preferable the array has reflectional symmetry about the long axis of the array, in order to achieve a symmetrical magnetic field distribution, and consequently an increased flux-coherence. More preferably, the voltage terminals also have reflectional symmetry about the long axis, and still more preferably the pick-up coils also have reflectional symmetry about the long axis. In this way, all superconducting parts of the array/layout have reflectional symmetry about the long axis. Preferably the array/layout also has reflectional symmetry with respect to an imaginary line perpendicular to, and bisecting the long axis allowing the magnetic field to be evenly distributed over each SQUID, and ideally so that each SQUID is penetrated by the same magnetic flux in order to achieve an enhanced degree of flux-coherence.

Preferably, the array of SQUIDs is formed, at least in part, of a high temperature superconducting material, capable of superconducting at temperatures above 30K, and is preferably mounted on a substrate. This is because at present temperatures of 30K can be reached with relatively cheap cryogen-free one-stage pulse tube cryocoolers.

More preferably, the material is superconducting at temperatures of 70K or greater, as in this case liquid nitrogen, another low-cost cooling method can be used to cool down the sensor. More preferably still the material is superconducting at temperatures of 77K or greater.

The arrival of high temperature superconductivity represents an important development in on-chip technology.

Up until now, there has been a primary focus on improving the efficiencies of semiconductor technology for use in integrated circuits and on-chip technology. However, progress in this field appears to have reached a plateau. Therefore, it is desirable to develop technologies which can be used in conjunction with semiconductor technologies. In order to improve the efficiencies of such technologies, development of superconductor technology is an obvious next step. In particular, the development of high-temperature superconductors (HTSCs), which can operate at temperatures around 77K. In this way, devices can be produced which can be cooled to superconducting temperatures by liquid nitrogen, which is far cheaper and more widely available than liquid helium, which was previously required, for achieving superconductivity in materials such as niobium. Temperatures of 30K can be reached with relatively cheap cryogen-free one-stage pulse tube low-noise cryocoolers. Therefore, even superconductor devices operating as temperatures as low as 30K are becoming more attractive.

In developing technology which can function using HTSCs, progress is made towards the superconductor and semiconductor fields being able to "meet in the middle" in terms of their operating temperatures, allowing the production of "hybrid" devices.

One example of a suitable HTSC, of which the array of the present invention is preferably formed is yttrium barium copper oxide ($YBa_2Cu_3O_{7-x}$). Preferably x takes values between 0.1 and 0.25, giving rise to a superconducting transition temperature of at least 50K. More preferably, the YBCO is "optimally doped", with x=0.15, giving rise to a superconducting transition temperature of around 89-92K. In all these cases, the intrinsic resistance of the YBCO Josephson junction is sufficient to ensure that there are no hysteretic effects in the behaviour of the junctions. This is beneficial as it removes the need to attach a shunt resistance across the junction, which therefore means that the device can be more easily miniaturized.

If YBCO superconductors are used then preferably, the substrate on which the array is mounted is made of strontium titanate $SrTiO_3$ or magnesium oxide MgO. This is because of their excellent compatibility as far as the epitaxial growth of the YBCO superconductor on these particular substrates is concerned. Indeed, any material compatible with the epitaxial growth of YBCO can be used as a substrate for the SQUID array fabrication. If superconducting materials other than YBCO superconductors are used to fabricate SQUID serial arrays then alternative materials that are compatible from the point of view of epitaxial thin film growth on the substrate should be used for the bicrystal substrate.

Preferably, the array of SQUIDs is formed from a bicrystal of the high temperature superconducting material such that the lattices of the two crystals making up the bicrystal are oriented such that the angle between them is non-zero at the boundary between them, and wherein the boundary between them forms the Josephson junction. In this case, the first side of the array would be formed from one crystal of the bicrystal and the second side of the array would be formed from the other crystal of the bicrystal.

Preferably, the bicrystal boundary defines the long axis of the array. More preferably the array has reflectional symmetry about the bicrystal boundary, and still more preferably the entire layout has reflectional symmetry about the bicrystal boundary. More preferably the array has reflectional symmetry about a line perpendicularly bisecting the bicrystal boundary drawn midway the array, and still more preferably the entire layout has reflectional symmetry about a line perpendicular to the bicrystal boundary drawn midway the array.

Figure 1A:
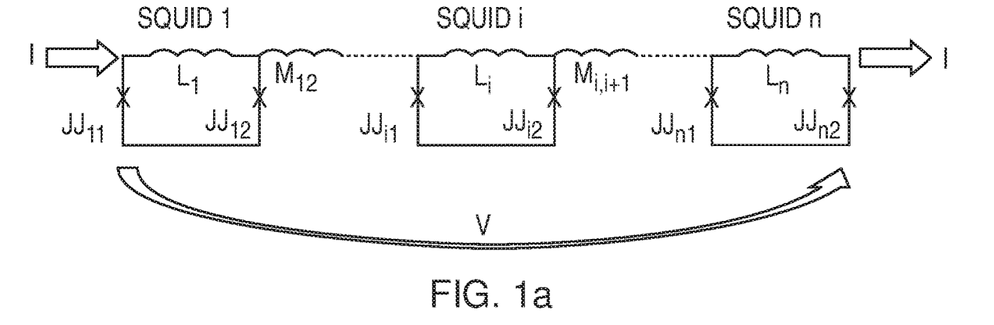
FIG. 1a shows a schematic circuit diagram of part of an array of SQUIDs connected in series according to and embodiment of the present invention.
Figure 1B:
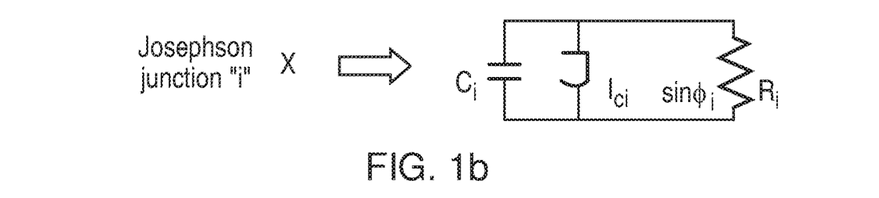
FIG. 1b shows a representation of a Josephson junction in the RCSJ model.
Figure 1C:
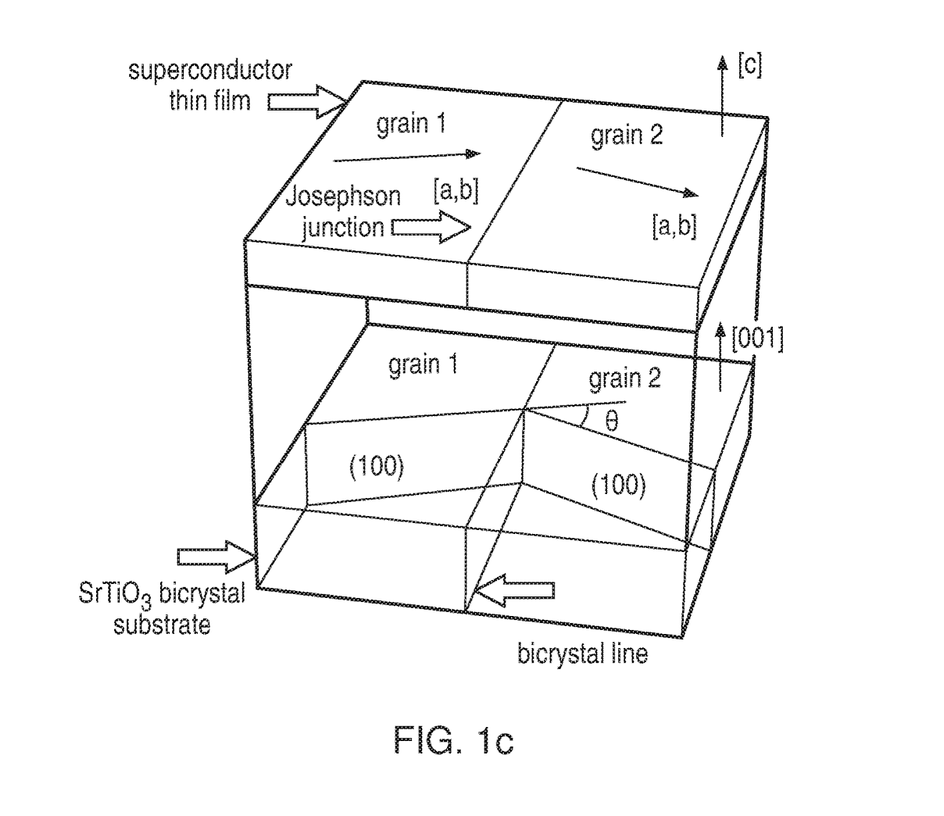
FIG. 1c shows schematically the realization of a Josephson junction in the bicrystal technology.

More preferably, the array of SQUIDs is fabricated using the bicrystal technology (see FIG. 1c). In this case a high temperature superconducting thin-film is epitaxially deposited on a $SrTiO_3$ or an MgO bicrystal substrate. To produce such bicrystal substrates, two c-axis oriented single crystals are joined together so that along the bicrystal line there is a misorientation angle θ° between the a and b axis of the two single crystals. The misorientation angle θ° takes specific values, such as 24°, 30°, 36.8° or 45° degrees. The bicrystal line, i.e., the boundary between the two single crystals, acts as a weak link between the two superconductors and therefore the Josephson junctions can be formed as superconducting bridges crossing the bicrystal line using standard photolithography technology.

When the array is fabricated using such bicrystal technology it is possible to adjust the critical current of the Josephson junctions by controlling the misorientation angle between the two lattices making up the bicrystal. The critical current $I_C$ is the maximum supercurrent which can flow through a Josephson junction without causing a voltage drop across the junction, $I_c$ decreases with increasing the misorientation angle from 24 degrees to 45 degrees.

An important characteristic property of SQUIDs is given by the screening parameter, given by $\beta_L = 2\pi I_C L_{SQ}/\phi_0$ where $I_C$ is the critical current of the SQUID, and $L_{SQ}$ is the characteristic self-inductance of the SQUID. It is known that for a single DC SQUID its maximum voltage response (and consequently sensitivity) to an externally applied magnetic flux to be measured is achieved for $\beta_L = 1$. Preferably, therefore, $\beta_L$ is in the range $0.5 < \beta_L < 2$. Since the critical current $I_C = J_C A$, where $J_C$ is the critical current density and A is the area (i.e. of the Josephson junction) across which the current density passes, it is clear that the value of $I_C$ can be controlled by controlling these two factors. The area of the junction can be varied by changing the thickness of the superconducting film and/or the width of the junction. By varying the degree of misorientation between the two parts of the bicrystal, the value of $J_C$ can be controlled too. The SQUID inductance $L_{SQ}$ is proportional to the perimeter of the SQUID hole.

The array of SQUIDs preferably includes a plurality of sub-arrays of SQUIDs, each sub-array itself being made up of a plurality of serially connected SQUIDs, and each sub-array being serially connected to at least one other sub-array. Preferably, the connections between the sub-arrays are superconducting connections. Preferably, the sub-arrays are identical. There may be variation in the SQUIDs within each sub-array, e.g. with the size of the superconducting loops or size of the junctions. Preferably these variations should not be larger than about 50%. That is the ratio of the minimum loop size to the maximum loop size should not be smaller than 50%. Also the ratio of the minimum junction size to the maximum junction size should not be smaller than 50%. Preferably, within each sub-array, the area of the superconducting loops decreases from the first SQUID in the sub-array to the last SQUID in the sub-array. In this way, the array is quasi-regular and the device will provide a voltage output $V(\phi)$ that is quasi-periodic with the applied flux to be measured $\phi$. In this particular case, since $V(\phi)$ is not exactly periodic but single-valued the array can be used to measure the absolute magnetic flux. If on the other hand, the area of all the superconducting SQUIDs loops are identical then $V(\phi)$ is periodical and the device performs as a sensitive magnetometer but cannot be used as an absolute magnetometer.

Preferably, each sub-array is made up of no less than 5 SQUIDs, more preferably each sub-array is made up of no less than 10 SQUIDs, still more preferably each sub-array is made up of no less than 15 SQUIDs, and most preferably each sub-array is made up of no less than 20 SQUIDs.

Preferably, the magnetometer of the present invention is made up of no less than 5 sub-arrays of SQUIDs, more preferably no less than 10 sub-arrays of SQUIDs, still more preferably no less than 15 sub-arrays of SQUIDs, and most preferably no less than 22 sub-arrays of SQUIDs.

Therefore in a most preferable embodiment, the magnetometer includes no less than 484 SQUIDs in 44 sub-arrays of 11 SQUIDs each. The combined voltage response of such a large number of coherent serially connected SQUIDs allows for a much larger voltage response than for an individual SQUID.

In order to measure the voltage response across the array, the magnetometer may include at least two connection points, to which a voltage-measuring device can be connected in order to measure the voltage response across those two connections. Preferably, the magnetometer also includes at least one further pick-off connection between two SQUIDs in the array such that it is possible to measure the voltage response over only part of the array. More preferably, the at least one further pick-off connection is between two sub-arrays of SQUIDs, and still more preferably, there are a plurality of pick-off connections, each located between two sub-arrays of SQUIDs. Most preferably, there is a pick-off connection between each pair of sub-arrays in the array.

The presence of pick-off connections allows a user to control the sensitivity of the device, measuring only across the desired number of SQUIDs. This can be advantageous, since the magnetometer's flux noise and field sensitivity are both proportional to $1/\sqrt{N}$ where N is the number of SQUIDs over which a measurement is taken.

The magnetometer of the present invention is preferably located on a chip. This is preferable because it allows the magnetometer to be incorporated into various devices.

At present magnetometers made of single DC SQUIDs are used in many applications in many different fields such as 1) biology:
   a) magnetoencephalography (to investigate neural activities inside the brain);
   b) cardiology for magnetic field imaging, which detects the magnetic field of the heart for diagnosis and risk stratification;
   c) magnetogastrography, which is concerned with recording the weak magnetic fields of the stomach;
   d) magnetic marker monitoring method, which is used to trace the path of orally applied drugs;
2) Research in material science:
   a) To build magnetic property measurement systems. These are turn-key systems, made by several manufacturers, that measure the magnetic properties of a material sample;
   b) as detectors to perform magnetic resonance imaging (MRI). While high-field MRI uses precession fields of one to several teslas, SQUID-detected MRI uses measurement fields that lie in the microtesla range and is less expensive to build and more compact;
   c) scanning SQUID microscopes to measure magnetic properties of materials;
3) Geology:
   a) oil prospecting, mineral exploration;
   b) earthquake prediction;
   c) geothermal energy surveying is becoming more widespread as superconductor technology develops;
4) scientific applications:
   a) particle detectors;
   b) gravitational waves detectors;

5) military:
   a) anti-submarine warfare as a magnetic anomaly detector fitted to maritime patrol aircraft;
   b) airborne weapon detection.

In all these applications, it is possible to replace the magnetometers based on a single DC SQUID with magnetometers based on a series array of DC SQUIDs with better results due to its enhanced sensitivity. Such a replacement would be straightforward as both magnetometers are very similar in size, and are operated in the same way.

In order to be located on a chip, the longest extent of the array of SQUIDs is preferably no more than 30 mm, more preferably no more than 10 mm, still more preferably no more than 8 mm and still more preferably no more than 6 mm. The maximum width of the array is preferably no more than 10 mm, and more preferably no more than 1 mm, and still more preferably no more than 0.5 mm.

According to a second preferred aspect, the present invention provides a serially connected array of superconducting quantum interference devices (SQUIDs), each SQUID including a superconducting loop having two Josephson junctions connected in parallel relative to each other;
   wherein each SQUID has a flux-focussing region, such that, when a magnetic flux is incident on the flux-focussing region, screening current is generated, giving rise to a voltage response, and
   wherein the simultaneous coupling of each SQUID to the incident magnetic flux causes the voltage responses of each SQUID to be in-phase with the responses of each of the other SQUIDs in the array.

Further optional features of the invention are set out below.

BRIEF DESCRIPTION OF THE DRAWINGS

Embodiments of the invention will now be described by way of example with reference to the accompanying drawings in which:

FIG. 3 shows a micro-photo of the fabricated magnetometer of FIG. 2a;

DETAILED DESCRIPTION AND FURTHER OPTIONAL FEATURES OF THE INVENTION

FIG. 1a shows a schematic circuit diagram of a serial array of SQUIDs suitable for use in a magnetometer of the present invention.

Each SQUID includes a superconducting loop containing two Josephson junctions and a flux-focussing region, the flux-focussing region configured to generate a screening current in response to the magnetic flux.

The Josephson junctions JJ are represented by crosses. Each SQUID "i" consists of two Josephson junctions $JJ_{i1}$ and $JJ_{i2}$ connected in parallel via a SQUID inductance $L_i$. Each pair of consecutive SQUIDs are connected in series via a mutual inductance $M_{i,i+1}$. The SQUID array is biased with a DC current I provided by a current source (not shown). The total voltage response V (i.e. the sum of the voltage across each individual SQUID) can be measured by a nanovoltmeter.

FIG. 1b shows the equivalent circuit of a Josephson junction "i" within the RCSJ (Resistively and Capacitively Shunted Junction) model. It consists of a parallel connection of a capacitance $C_i$, a resistance $R_i$ and the non-linear element Josephson current $I_{Ci} \sin(\phi_i)$.

FIG. 1c shows schematically the realization of a Josephson junction in the bicrystal technology. In this technology a high temperature superconducting thin-film is epitaxially deposited on a $SrTiO_3$ or an MgO bicrystal substrate. To produce such bicrystal substrates, two c-axis oriented single crystals are joined together so that along the bicrystal line there is a misorientation angle θ° between the a and b axis of the two single crystals. The misorientation angle θ° takes specific values, such as 24°, 30°, 36.8° or 45° degrees. The bicrystal line, i.e., the boundary between the two single crystals, acts as a weak link between the two superconductors and therefore the Josephson junctions can be formed as superconducting bridges crossing the bicrystal line using standard photolithography technology.

Figure 2A:
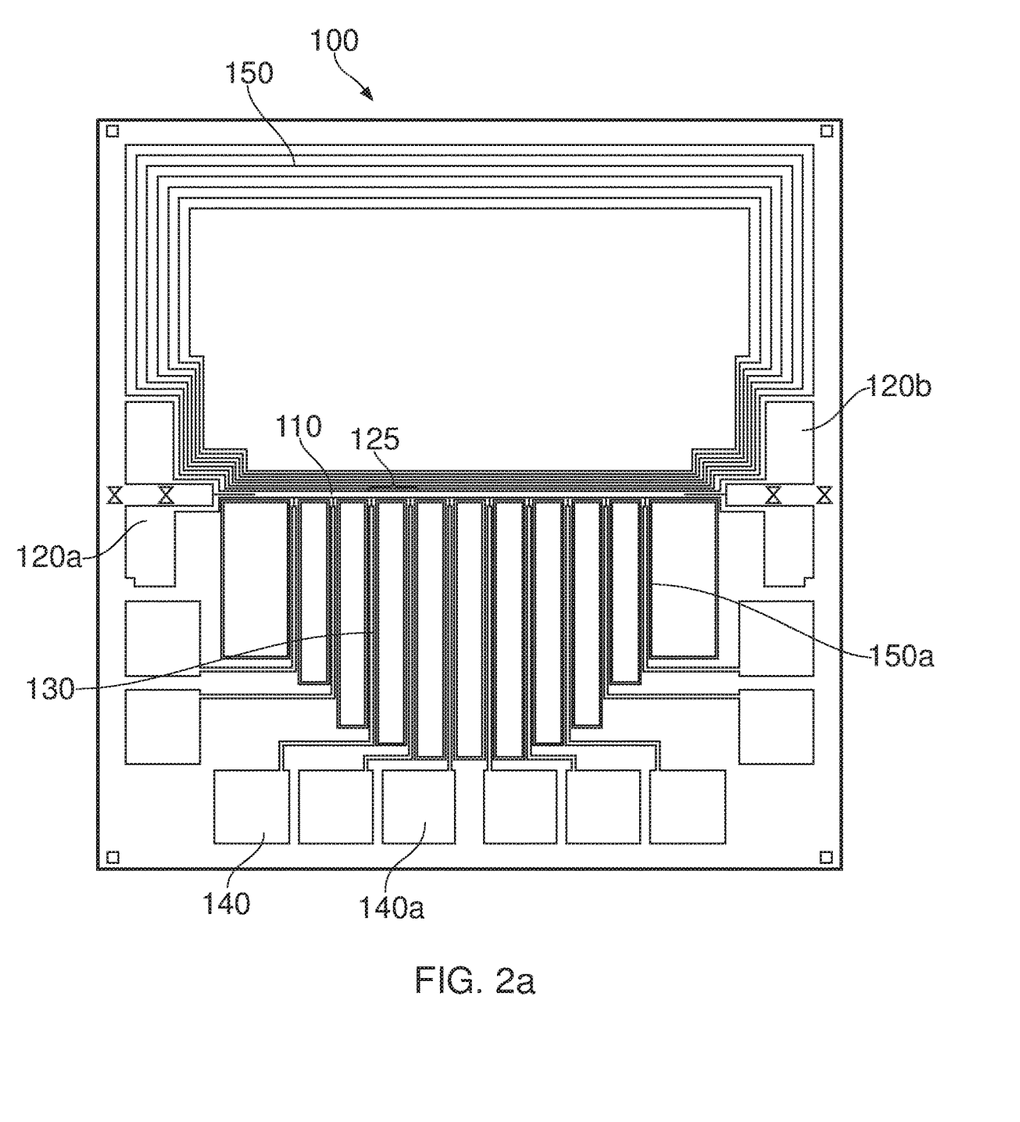
FIG. 2a is a diagram showing the asymmetric layout of a magnetometer according to an embodiment of the present invention.
Figure 2B:
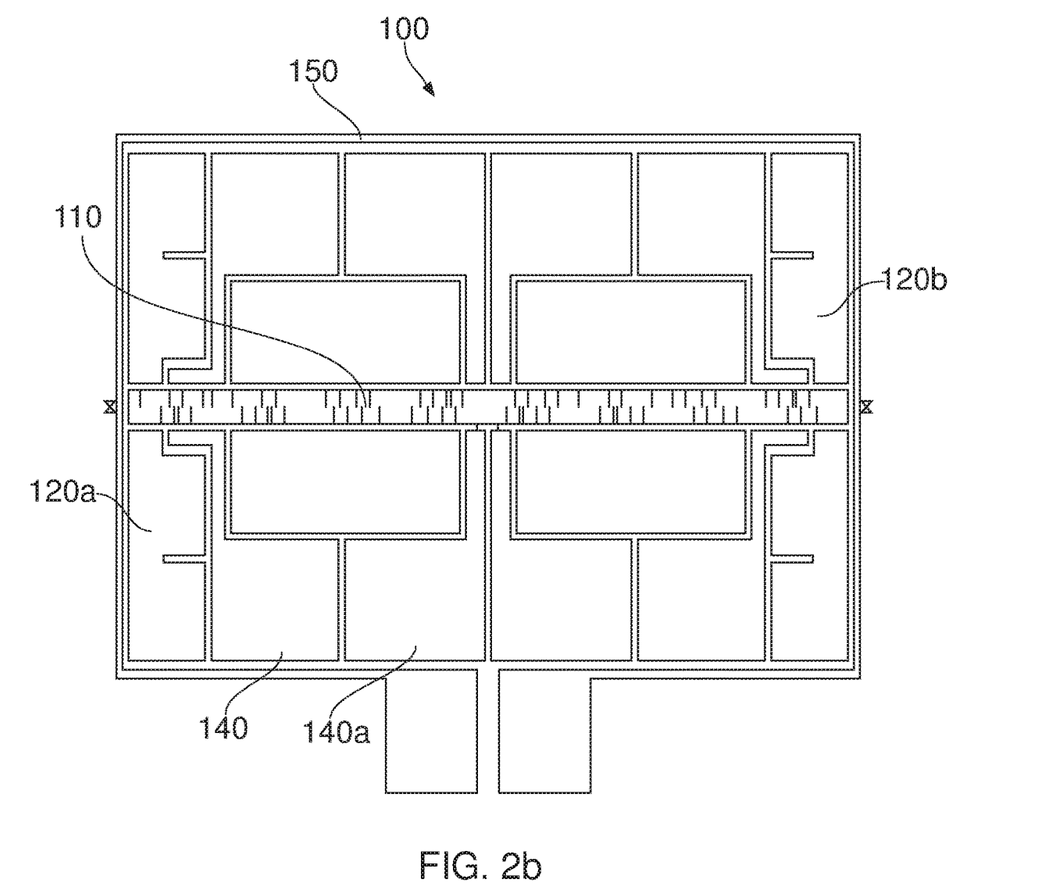
FIG. 2b is a diagram showing a symmetric layout of a magnetometer according to an embodiment of the present invention. The asymmetry and symmetry are with respect to an imaginary line separating the square design into two identical parts: the upper half and the bottom half.

FIG. 2a shows an example of an asymmetric layout of a magnetometer 110 according to the present invention. FIG. 2b shows an example of a symmetric layout of a magnetometer 110 according to the present invention. To achieve superior flux-coherent operation a symmetrical layout is preferable.

Figure 4:
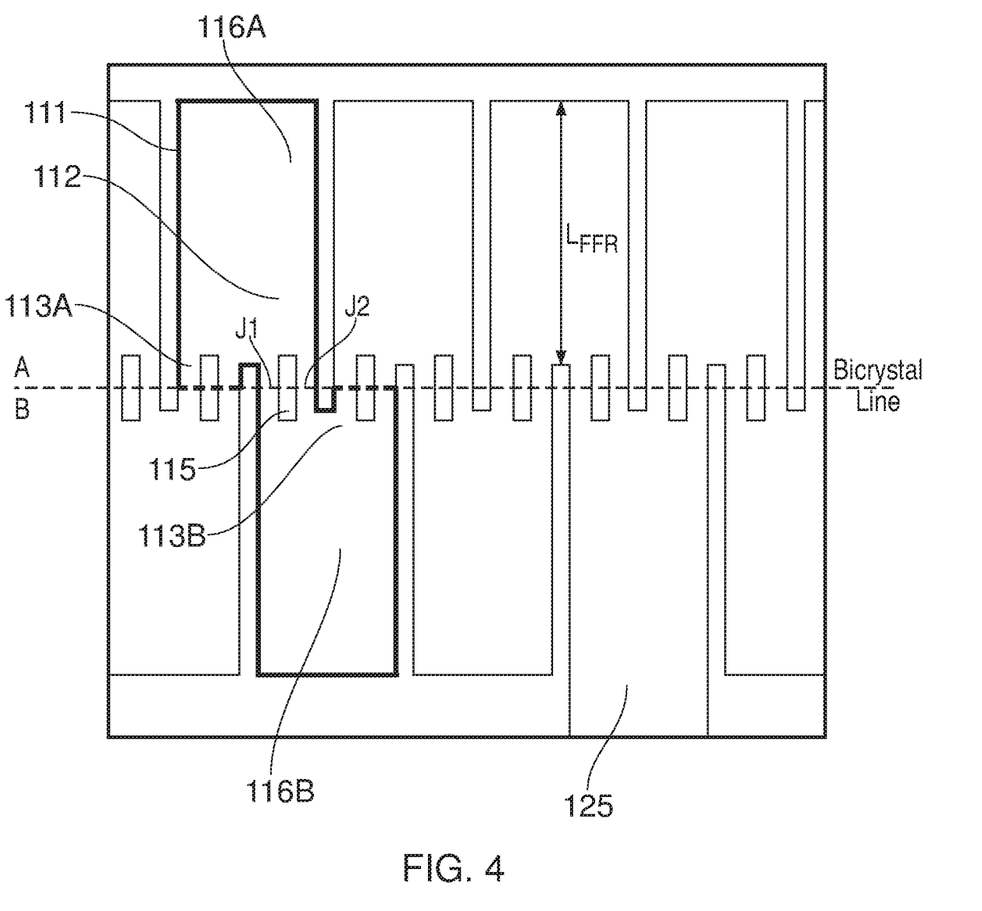
FIG. 4 shows a detailed layout of part of the array of SQUIDs according to a first embodiment of the present invention.

The SQUID array 110 is located at the centre of the magnetometer 100. In this embodiment, the SQUID array 110 is a straight, linear array. Details of a part of the array itself are shown in FIG. 4. At each end of the array 110 is a voltage terminal 120a, 120b which can be connected to a voltmeter (not shown) in order to measure the summed voltage across the whole array 110. In the embodiment of FIG. 2a, the length of the array is 5808 μm. In the embodiment of FIG. 2b, the length of the array is 9240 μm.

Figure 3:
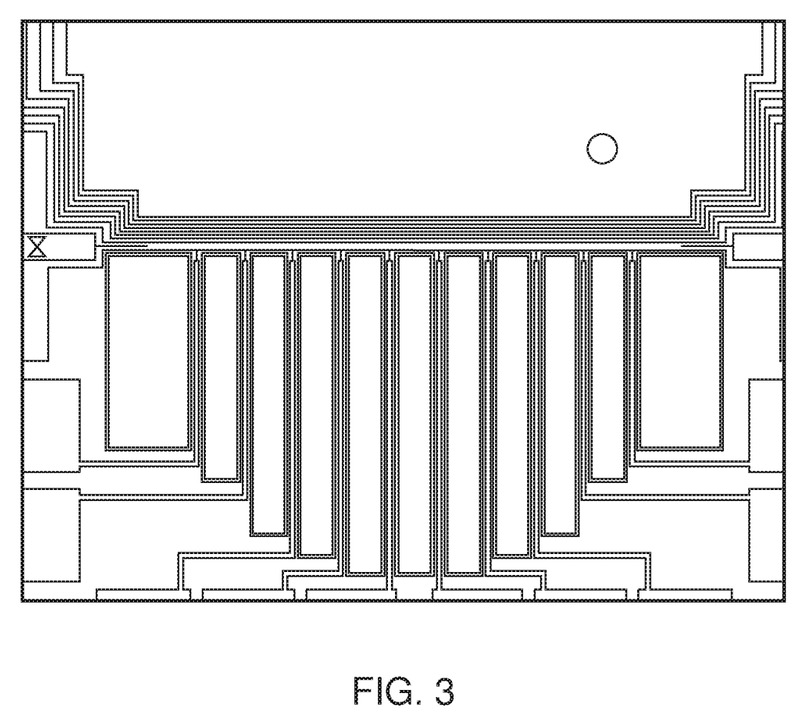

A micro photo of a series array of SQUIDs fabricated according to the embodiment shown on FIG. 2a of the present invention is shown in FIG. 3. The array is made up of 11 identical sub-arrays 125, each containing 4×11 individual SQUIDs (not visible in FIG. 3, but see micro-photo in FIG. 6 in which the SQUIDs are visible). In the array 110 shown in FIGS. 2a and 3, there are 484 SQUIDs, containing a total of 968 Josephson junctions. Details of the junctions themselves are described below, in relation to FIG. 4. Between each sub-array 125 there is a pick-off connection 130, each pick-off connection leading to a voltage terminal 140.

Instead, for example, of connecting the voltmeter across the voltage terminals 120a and 120b, and in doing so taking a reading across all 484 SQUIDs in the array 110, it is possible to take a reading over, for example voltage terminal 120a and voltage terminal 140a, in order only to take a reading over 5×4×11=220 SQUIDs. The voltage terminal 140 which is chosen determines the sensitivity of the measurement made. The multiple rectangular shaped superconducting coils 150, 150a located on both sides of the design are the pick-up coils of the SQUID serial array for enhancing the magnetic flux sensitivity of the magnetometer.

FIG. 4 shows a zoomed in view of the SQUID array 110 in the magnetometer 100 layout of FIG. 2a.

The structure of the array 110 at this point is best described in relation to a series of repeating units 116 (made of 116a and 116b) which are single DC SQUIDs.

The magnetometer 100 shown in both FIGS. 2a and 3, is fabricated using bicrystal technology. In this technology schematically shown in FIG. 1c two c-axis oriented $SrTiO_3$ single crystals (grains) are joined together to form a bicrystal substrate. There is a misorientation angle θ° of either 24°, 30°, 36.8° or 45° between the a and b axis of the single crystals. An YBCO superconducting thin film is deposited on top of the $SrTiO_3$ substrate. The bicrystal line, i.e., the boundary between the two single crystals, acts as a weak link between the two superconductors and therefore the Josephson junctions can be formed as superconducting bridges crossing the bicrystal line using standard photolithography technology. The Josephson junctions are seen as bridges crossing the bicrystal line shown with dotted line running across the centre of the array 110 in FIG. 4. The bicrystal line divides the array 110 into a first side A and a second side B.

The structure will be described with reference to the left-most repeating unit 111 (highlighted). This repeating unit 111 is made up of two half loops and a central full superconducting loop ("full loop") 112 in between them. Repeating unit 111 is connected to two flux-focussing regions 116A and 116B on sides A and B respectively.

Flux-focussing region 116A is connected also to a second half-loop 113A which, assuming that current flows (i.e. meanders along the bicrystal line) from left to right in the array, is a half-loop on side A of the array, which is part of the full-loop through which current flows before full-loop 112. Flux-focussing region 116B is also connected to a second half-loop 113B, on side B of the array, the half-loop 113B being part of the full-loop which comes after full-loop 112 in the array.

In this embodiment, flux-focussing regions 116A and 116B are rectangular sections of the same superconducting material as the loops 112, 113A, 113B, which are attached to the edges of these loops. In this micro-photo shown in FIG. 3, the superconducting material is YBCO. The total width of the array is 88 μm (see FIGS. 4, 5 and 6), with each flux-focussing region, e.g. 116A being approximately 40 μm long (see $L_{FFR}$).

In full loop 112, and all other full loops in the array, the half-loop 113A and half-loop 113B are each composed of one part of the two crystals making up the bicrystal. The full loop 112 contains two identical Josephson junctions $J_1$ and $J_2$ which can be seen as two parallel bridges across the bicrystal line represented with dotted line. The two half-loops of the full loop 112 meet at the bicrystal line, which acts as a weak link between the two superconducting single crystals due to the misalignment of the two crystals. This arrangement allows loop 112 to act as a single DC SQUID.

In this embodiment, when moving along the array 110, from left to right, as in FIG. 4, the holes 115 of each successive loop 112 increase in height. In each set of 11 SQUIDs, the size of the hole 115 increases monotonically from 8×3 μm to 12×3 μm, then returning back to 8×3 μm at the beginning of the next set of 11. The space between each flux-focussing region and the adjacent flux-focussing region on the same side is also 3 μm. This size is limited by the photolithography process used to etch the array 110 from a single bicrystal.

In this embodiment, pick-off connection 125 is integrally formed with a flux-focussing region, and leads to a pick-off terminal 140 (see FIG. 2a).

Figure 5:
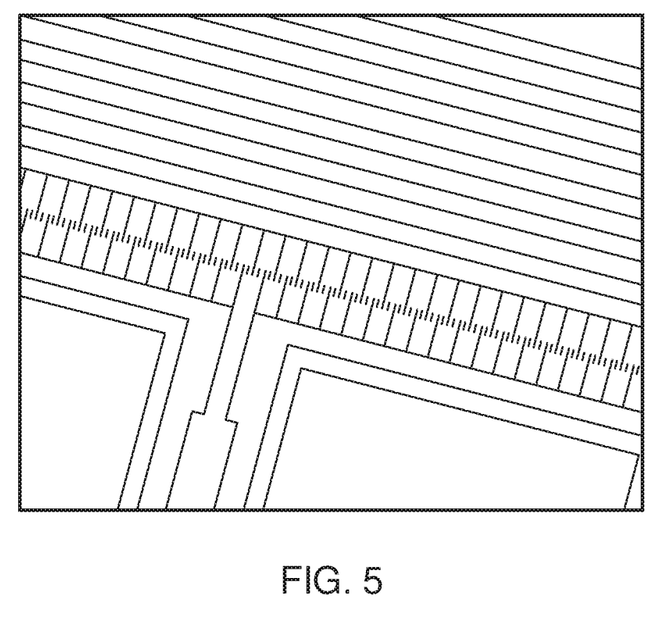
FIG. 5 shows a micro-photo of part of the fabricated array of SQUIDs shown in FIG. 4.
Figure 6:
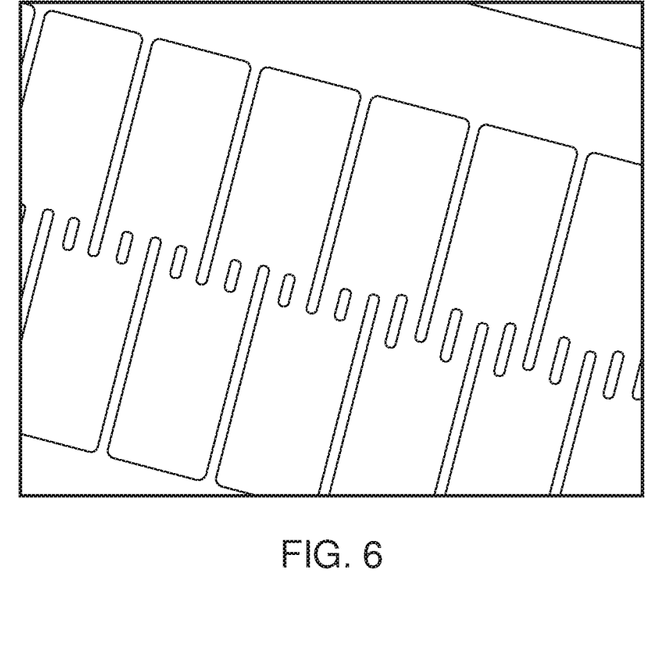
FIG. 6 shows a high-resolution micro-photo of part of the SQUID array shown in FIG. 4.

FIGS. 5 and 6 show micro-photos of a magnetometer fabricated in accordance with the design of FIG. 4.

Figure 7:
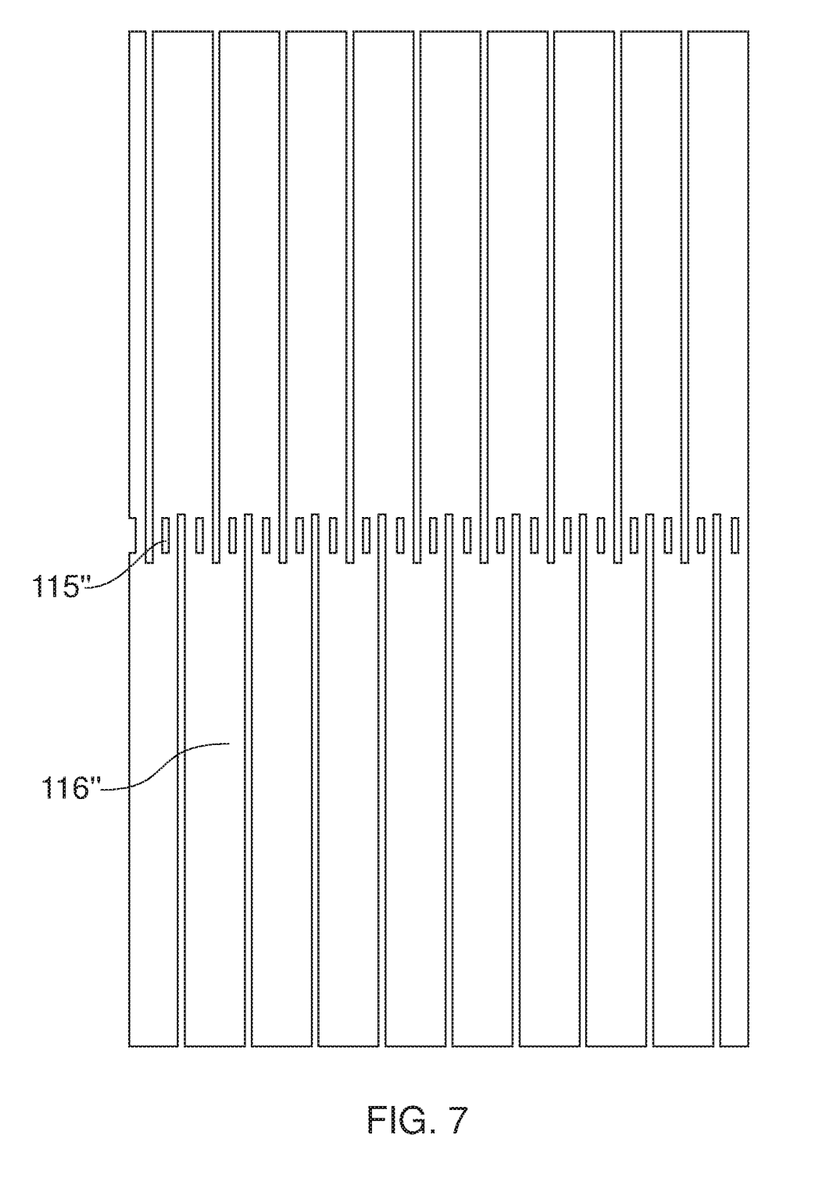
FIG. 7 shows part of the design of the array of SQUIDs according to a second embodiment of the present invention; in this case the narrow flux-focusing regions are larger in size.

FIG. 7 shows a series array of SQUIDs according to a second embodiment of the present invention. This is identical to the array of the first embodiment, differing only in the dimensions of the holes in the centre of the loops 115' and the flux-focussing regions 116'.

In this embodiment, the holes 115" are all the same size, which is 10×3 μm. The flux-focussing regions are also larger. The entire width of the array 110' in this embodiment is 400 μm.

Experimental Results

Figure 8:
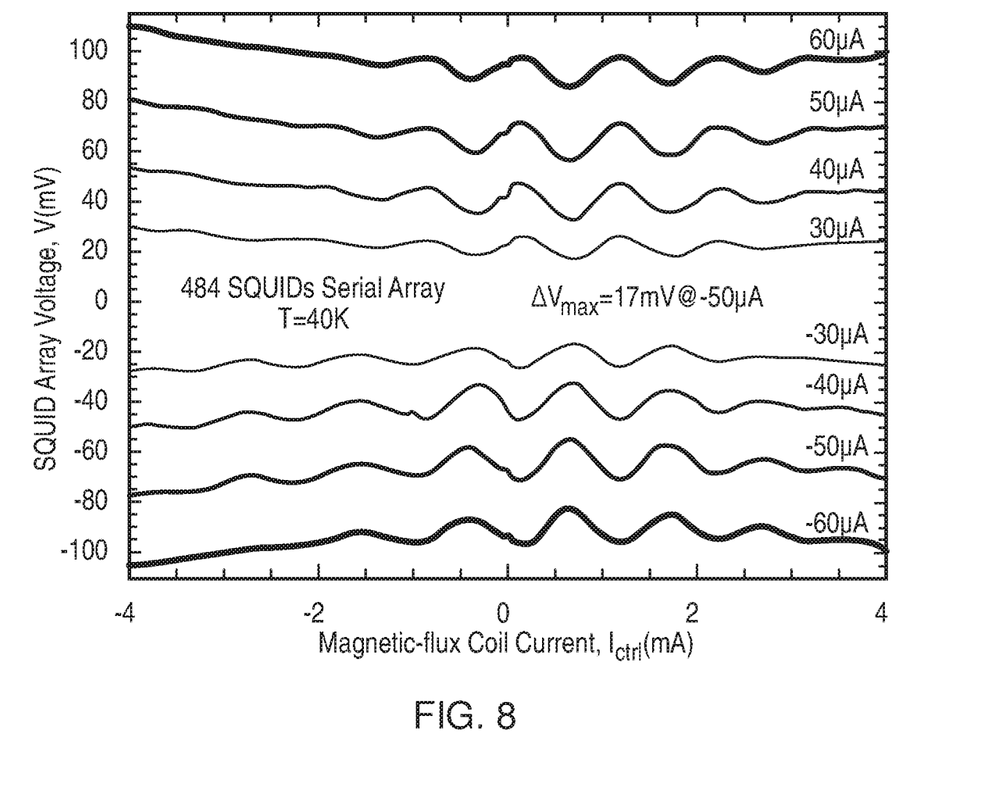
FIG. 8 shows the total voltage response versus an externally applied flux to be measured (produced by a dc current $I_{ctrl}$ in a magnetic coil) recorded at a temperature T=40K obtained using a magnetometer according to an embodiment of the present invention. This particular magnetometer consists of 44×11=484 SQUIDs connected in series.

FIG. 8 shows the voltage response as a function of an externally applied flux to be measured of a magnetometer according to an embodiment of the present invention. The series SQUID arrays were fabricated by depositing high quality epitaxial, 100-150 nm thick c-axis oriented $YBa_2Cu_3O_{7-x}$ (YBCO with x=0.15) films on 10×10 mm², θ° symmetric [001] tilt $SrTiO_3$ bicrystals by pulsed laser deposition (see FIG. 1c and FIG. 3). Angle θ° can take the following values: 24°, 30°, 36.8° or 45°. A 200 nm thick Au layer was deposited in situ on top of the YBCO film to facilitate fabrication of high quality electrical contacts for electric transport measurements. The films, with a critical temperature of $T_c$ of 92K, were subsequently patterned by optical lithography and etched by an Ar ion beam to form a serial array of 44×11 SQUIDs consisting of 44 identical sub-arrays of 11 SQUIDs. All 484 SQUIDs have 2 identical 3 μm wide Josephson junctions. Within each sub-array of 11 SQUIDs the SQUIDs have superconducting loops of identical width of 3 μm while the length of these loops varies logarithmically from 12 μm to 8 μm.

The value on the x-axis is the current $I_{ctrl}$ used to drive the applied magnetic field, and is directly proportional to the magnetic flux. Clearly, the results display the expected quasi-periodic nature: 7 oscillations are clearly visible which are symmetrically distributed around the largest oscillation which has its maximum at about $I_{ctrl}$ 1.2 mA.

The results were taken at 40K, and using a range of current biases from −60 μA to 60 μA. It is known that the array can be biased at any bias current (as long as it is greater than the critical current of the Josephson junctions within the array) and display signal modulation with the magnetic flux. The response is not linear, however, and the maximum peak-to-peak voltage $\Delta V_{max}$ in this case was achieved at a current biases of −50 μA and 50 μA. Here, $\Delta V_{max}$=17 mV, which is of the order of a thousand times greater than what can typically be achieved from single DC SQUIDs at comparable temperatures. It is noted that for a specific design layout the maximum peak-to-peak voltage $\Delta V_{max}$ is reached at a unique certain temperature where the condition $\beta_L=1$ is fulfilled. Since $\beta_L$ is proportional to the Josephson junction's critical current $\beta_L$ increases monotonically with decreasing temperature. $\beta_L$ is also proportional to the SQUID inductance whose value can be controlled while designing the SQUID array layout. Therefore, for alternative array layouts, the maximum peak-to-peak voltage $\Delta V_{max}$ can be reached at any desirable temperature, in particular, at any temperature in the range 4.2-90 K.

These results demonstrate the effects of the "in-phase" condition in a serial SQUID array consisting of 484 SQUIDs. The maximum output signal measured for this particular array was 17 mV which is 484 times larger than about 35 μV which is about twice larger than that of a typical output voltage of the best single DC SQUIDs at the same temperature of 40 K.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

The invention claimed is:

1. A magnetometer for measuring an applied magnetic flux, the magnetometer comprising:
   an array of superconducting quantum devices (SQUIDs) connected in series, each SQUID in the array including a superconducting loop containing two Josephson junctions connected to each other in parallel; and
   a set of flux-focussing regions, each of the set of flux-focussing regions being associated with a corresponding SQUID in the array, each of the set of flux-focussing regions being configured to generate a screening current in response to the applied magnetic flux, the screening current modulating the corresponding voltage response of the corresponding SQUID such that the voltage response of the corresponding SQUID is in-phase with the voltage response of each other SQUID in the array.

2. A magnetometer according to claim 1, wherein the array is linear, and defines a long axis of the array.

3. A magnetometer according to claim 2, wherein the flux-focussing region is an additional portion of superconducting material connected to a portion of the superconducting loop of each SQUID.

4. A magnetometer according to claim 3, wherein the additional portion of superconducting material is integrally formed with the superconducting loop of the SQUID.

5. A magnetometer according to claim 4, wherein the flux-focussing regions which are connected to a portion of the superconducting loop of the SQUID extend outwards from the array in a direction which is substantially perpendicular to the long axis of the array.

6. A magnetometer according to claim 5, wherein each flux-focussing region has a length, measured in a direction perpendicular to the long axis of the array, and a width, measured in a direction parallel to the long axis of the array, the length being longer than the width.

7. A magnetometer according to claim 1, wherein:
   when the voltage response of an $i^{th}$ SQUID in the array is defined as $V_i = V_{i,max} \cos(\Phi_i/\Phi_0)$, the voltage response of an $(i+1)^{th}$ SQUID in the array is defined as $V_{i+1} = V_{i+1,max} \cos(\Phi_{i+1}/\Phi_0)$, the phase difference between the $i^{th}$ and $(i+1)^{th}$ SQUID is defined as $(\Phi_i - \Phi_{i+1})/\Phi_0$, and there are N SQUIDs in the array
   the phase difference between the $i^{th}$ and $(i+1)^{th}$ SQUID deviates by no more than $\pi/N$ from $2\pi k$, where k is an integer.

8. A magnetometer according to claim 1, wherein each flux-focussing region in the array is connected to at least two SQUIDs in the array.

9. A magnetometer according to claim 1, wherein each SQUID in the array is connected to at least two flux-focussing regions in the array.

10. A magnetometer according to claim 7, wherein each superconducting loop contains two half-loops of superconducting material, the two half-loops being separated from each other by a gap which forms the two Josephson junctions,
    and wherein when one side of the long axis of the array defines a first-side, and the other side of the long axis of the array defines a second-side, the array is formed of a series of repeating units, wherein each repeating unit includes:
    a first-side flux-focussing region on a first side of the array connected to:
       a first-side half-loop of a first superconducting loop, and
       a first-side half-loop of a second superconducting loop; and
    a second-side flux-focussing region on a second side of the array connected to:
       a second-side half-loop of the second superconducting loop, and
       a second-side half-loop of a third superconducting loop.

11. A magnetometer according to claim 8, wherein the array has reflectional symmetry about the long axis of the array.

12. A magnetometer according to claim 1, wherein the array of SQUIDs is formed, at least in part, of a high temperature crystalline superconducting material, capable of superconducting at temperatures above 30K.

13. A magnetometer according to claim 10, wherein the high temperature superconducting material is yttrium barium copper oxide.

14. A magnetometer according to claim 1, wherein the array of SQUIDs is formed from a bicrystal of the high temperature superconducting material, such that the lattices of the two crystals making up the bicrystal are oriented such that the angle between them is non-zero at the boundary between them, and wherein the Josephson junctions are formed at the boundary.

15. A magnetometer according to claim 1, wherein the array of SQUIDs includes a plurality of sub-arrays of SQUIDs, each sub-array itself being made up of a plurality of serially connected SQUIDs, and each sub-array being serially connected to at least one other sub-array.

16. A magnetometer according to claim 12 wherein, within each sub-array, the area of the superconducting loops decreases from the first SQUID in the sub-array to the last SQUID in the sub-array.

17. A method of fabricating a serially connected array of superconducting quantum interference devices (SQUIDs) of claim 1, including the steps of:
    depositing epitaxially a thin film of superconducting material onto a bicrystal substrate;
    depositing a layer of electrically conductive material on top of the thin film of superconducting material;

patterning the electrically conductive layer and the thin superconducting film using optical lithography, to form the layout of the serially connected array;

etching the pattern using an argon ion beam.

18. A method according to claim 17, wherein the superconducting material is yttrium barium copper oxide, and the substrate is strontium titanate.

19. A serially connected array of superconducting quantum interference devices (SQUIDs), each SQUID in the array including a superconducting loop having two Josephson junctions connected in parallel relative to each other;

wherein each SQUID includes a flux-focussing region of a set of flux-focussing regions, such that, when a magnetic flux is incident on the flux-focussing region, a screening current is generated that modulates the voltage response, and wherein the simultaneous coupling of each SQUID to the incident magnetic flux causes the voltage responses of each SQUID to be in-phase with the responses of each of the other SQUIDs in the array.

20. A serially connected array of SQUIDs according to claim 19, wherein when the voltage response of an $i^{th}$ SQUID in the array is defined as $V_i = V_{i,max} \cos(\Phi_i/\Phi_0)$, the voltage response of an $(i+1)^{th}$ SQUID in the arrays defined as $V_{i+1} = V_{i+1,max} \cos(\Phi_{i+1}/\Phi_0)$, the phase difference between the $i^{th}$ and $(i+1)^{th}$ SQUID is defined as $(\Phi_i - \Phi_{i+1})/\Phi_0$, and there are N SQUIDs in the array the phase difference between the $i^{th}$ and $(i+1)^{th}$ SQUID deviates by no more than $(\pi/N)$ from $2\pi k$, where k is an integer.

* * * * *